United States Patent [19]

Wensink

[11] Patent Number: 5,443,675
[45] Date of Patent: Aug. 22, 1995

[54] PLASTIC MOLD PACKAGE DEVICE DECAPSULATOR WITH FLAT, SEPARATE ETCH HEAD AND ETCH PLATE

[76] Inventor: Ben L. Wensink, 171 Big Horn Ridge NE., Albuquerque, N. Mex. 87122

[21] Appl. No.: 121,720

[22] Filed: Sep. 15, 1993

[51] Int. Cl.⁶ .............................................. C23F 1/02
[52] U.S. Cl. ................................ 156/345; 437/923; 216/59; 216/90
[58] Field of Search ................ 156/345, 627, 640; 437/923

[56] References Cited

U.S. PATENT DOCUMENTS

| | | | |
|---|---|---|---|
| 4,344,809 | 8/1982 | Wensink | 156/345 |
| 4,359,360 | 11/1982 | Harris et al. | 156/640 |
| 4,384,917 | 5/1983 | Wensink | 156/627 |
| 4,822,441 | 4/1989 | Ohta et al. | 156/345 |
| 4,826,556 | 5/1989 | Kobayashi | 156/345 |
| 4,961,812 | 10/1990 | Baerg et al. | 156/345 |
| 5,041,229 | 8/1991 | Brock et al. | 156/640 |
| 5,252,179 | 10/1993 | Ellerson et al. | 156/345 |

OTHER PUBLICATIONS

Brochure, "Plastic Mold Decapsulation System PA102," Nippon Scientific Co., Ltd. (date unknown).
Naoki Yoshida, et al., "Plastic Mold Opener that Uses Fuming Nitric Acid as Dissolving Liquid," pp. 137–143. (date unknown).
Brochure and Application Notes, Novus Technologies "Jet Etch". (date unknown).

Primary Examiner—George Fourson
Assistant Examiner—Long Pham
Attorney, Agent, or Firm—Thomas E. Schatzel

[57] ABSTRACT

A decapsulation embodiment of the present invention comprises clamping a device-under-test to a fixture with a non-recessed etch head. The fixture has an etch plate with a hole that defines the area on the device-under-test for the decapsulation. Electrical access is provided to the package pins of the device-under-test. The fixture comprises a support with connections for the pins and the etch-resistant etch plate on top with the hole for locating over the site of the active die within the device-under-test package. The hole is sized to define the proper dissolved opening dimensions for decapsulation and is deep enough to enable decapsulation to start and yet not so deep that fresh etchant solution cannot reach the surface of the device-under-test. The device-under-test is placed on top of the support and covered with a etch plate. The whole assembly is then clamped together.

7 Claims, 1 Drawing Sheet

PLASTIC MOLD PACKAGE DEVICE DECAPSULATOR WITH FLAT, SEPARATE ETCH HEAD AND ETCH PLATE

BACKGROUND OF THE INVENTION

1. Field of the Invention

The present invention relates generally to electronic device plastic mold package decapsulation, and more particularly to jet etching of such devices.

2. Description of the Prior Art

Decapsulation of integrated circuits (IC) in their plastic packages has become widely popular as a method incorporated in analyzing such circuits to ensure their reliability and to reverse engineer devices. One method of decapsulation involves a very risky process of pooling fuming nitric or sulfuric acid, and requires great skill in order to avoid damaging the samples to be analyzed.

Both dry and wet methods of decapsulation are conventionally used to open plastic mold packages. The wet method uses an etching process by acid or solvent. The dry method employs burning with high frequency-excited oxygen or gaseous FREON. The dry method has a much poorer processing capacity, and so is seldom used.

Conventional wet methods include one in which a device-under-test (DUT) is masked with adhesive tapes and soaked in fuming nitric or sulfuric acid heated to 60°– C. Only the unmasked portions will be dissolved. Another wet method indents the device-under-test on its chip-side with an end mill, or similar machine, and heats it on a hot plate. Then fuming nitric or sulfuric acid is pooled into the indentations to commence a gradual etching in locations controlled by the indentations.

Red fuming nitric acid is reported by at least one industry equipment supplier to be thoroughly tested by the industry's leading failure analysis and reliability engineers. They have determined that red fuming nitric acid is a good etchant for decapsulating plastic mold IC packages having aluminum components. An alternate etchant, concentrated sulfuric acid, is claimed to cause damage to both the device-under-test and aluminum bonding pads. The present inventor, however, has not experienced such problems with aluminum corrosion when using sulfuric acid. When dispensed at a relatively low temperature, e.g., 65° C., red fuming nitric acid reportedly forms an oxidation layer over any aluminum components, thereby protecting them from damage by corrosion. The present inventor prefers the use of concentrated sulfuric acid since it forms an oxidation layer on exposed aluminum at higher temperatures, e.g., 220° C. Thus, faster decapsulation is possible, compared to fuming nitric acid.

A jet etch apparatus for decapsulation of molded devices is described in U.S. Pat. No. 4,344,809, issued Aug. 17, 1982, to the present inventor, Ben L. Wensink (Wensink '809). An etchant solution is drawn through an etching block and forms a jet spray that impinges on the device-under-test. A jet pump creates a suction that draws the etchant solution into the jet stream. The decapsulation process is monitored by detecting a current flow between an electrode in contact with the etchant solution and the device. The imposed current serves to protect the aluminum against corrosion by cathodic action, and it assists in monitoring the progress of decapsulation.

A jet etch method for decapsulation of molded devices is described in U.S. Pat. No. 4,384,917, issued May 24, 1983, also to the present inventor, Ben L. Wensink (Wensink '917).

The Wensink patents describe an etch head with a shallow recess with a nozzle opening in relatively close proximity to the device-under-test which is on top of the etch head. Fresh etchant solution from the nozzle reaches the device-under-test there and can etch the surface.

For the relatively large dual-in-line (DIP) plastic packages that were prevalent in the 1980's, such a construction was very sensible. A plastic DIP could be used to cover the recess opening in the etch head and thereby seal in the necessary vacuum within the recess to support decapsulation jet spraying of the etchant solution. But there has been a trend toward smaller and thinner packages that have connector prongs instead of pins. Such prongs include J-types that exit the packages along the side edges and then curl back underneath. Small outline packages (SOT) have very tiny side pins. The variability in packaging and reduction in sizes has created difficulties in using conventional decapsulation machines and methods. Such packages become mechanically fragile after decapsulation, since most of the plastic material along the top surface of the package is dissolved away. Subsequent handling of the decapsulation device can easily result in losing pins and the electrical destruction of the device.

Other modern package concepts provide the necessary electrical connections to the semiconductor device die on the inside through a matrix of small solder bumps, e.g., bump grid array (BGA), or by small solder columns, e.g., column grid array (CGA). Both such packaging concepts are strongly promoted, for example by IBM and Motorola. Surface mount technology (SMT) packages include the use of gull-wing pins, S-shaped pins that horizontally exit the package along the edges and then are bent down and out again to form a horizontal foot.

A need therefore exists for fixtures that can be used in a decapsulation process that do not require that a device be removed from the fixture for subsequent electrical characterization. The decapsulation hole that is made needs to be strictly defined to allow for a ring of material that will be left undisturbed and that will allow a degree of mechanical stability to remain with the device-under-test for further study.

More advanced fixturing for jet etch machines is required for the larger die-size to package-size ratios that exist in modern device packages. Less plastic material exists around a typical semiconductor device die, and accurate placement of the package with respect to the decapsulation hole defined by an etch plate is increasing in importance. By combining the etch plate with the fixture, this goal could be readily accomplished. In the prior art, the accuracy of decapsulation depends on the placement accuracy of the device with respect to the etch head of the machine.

SUMMARY OF THE INVENTION

It is therefore an object of the present invention to provide an apparatus for decapsulation of plastic mold packages.

It is a further object of the present invention to provide a method for decapsulation of plastic mold packages.

Briefly, a decapsulation embodiment of the present invention comprises clamping a device-under-test to a fixture placed on a non-recessed etch head. The fixture defines the opening for the decapsulation and provides electrical access to the package pins of the device-under-test. The fixture comprises a support with connections for the pins and an etch-resistant etch plate on top with a hole for locating over the site of the active die within the device-under-test package. The hole is sized to define the proper dissolved opening dimensions for decapsulation and is deep enough to enable decapsulation to start and yet not so deep that fresh etchant solution cannot reach the surface of the device-under-test. The device-under-test is placed on top of the support and covered with the top plate. The whole assembly is then clamped together.

An advantage of the present invention is that a decapsulation machine is provided that is suitable for use with small outline (SOT) packaged plastic mold devices.

Another advantage of the present invention is that a method for decapsulation is provided that is suitable for use with small outline (SOT) packaged plastic mold devices.

A still further advantage of the present invention is a machine is provided in which alignment of the etch plate with respect to a device-under-test is solved by either the specific fixture design or by use of a fixture where a device can be accurately positioned with respect to the opening in the etch plate. Once this positioning away from the jet etch machine has been done, no critical positioning of the fixture-cum-device is necessary with respect to the etch head of the machine, so long as the inlet and outlet openings in the etch head are within the recess of the fixture's etch plate.

An advantage of the present invention is a machine is provided in which packages with relatively larger semiconductor device dies can be successfully decapsulated and tested.

Another advantage of the present invention is a machine is provided in which the device-under-test can stay in the fixture during subsequent rinsing and testing.

A still further advantage of the present invention is a machine is provided in which auxiliary heating can be provided to preheat the device-under-test to expedite the decapsulation process and prevent metal corrosion during intermediate observations.

An advantage of the present invention is a machine is provided in which etch head adaptations for differently sized packages and styles is not needed, because these problems are addressed in the fixture design.

An advantage of the present invention is a machine is provided in which a gasket material is used to surround the device-under-test to avoid problems whenever a side wall is etched through.

These and other objects and advantages of the present invention will no doubt become obvious to those of ordinary skill in the art after having read the following detailed description of the preferred embodiment which is illustrated in the various drawing figures.

IN THE DRAWINGS

DETAILED DESCRIPTION OF THE PREFERRED EMBODIMENT

Figure 1:
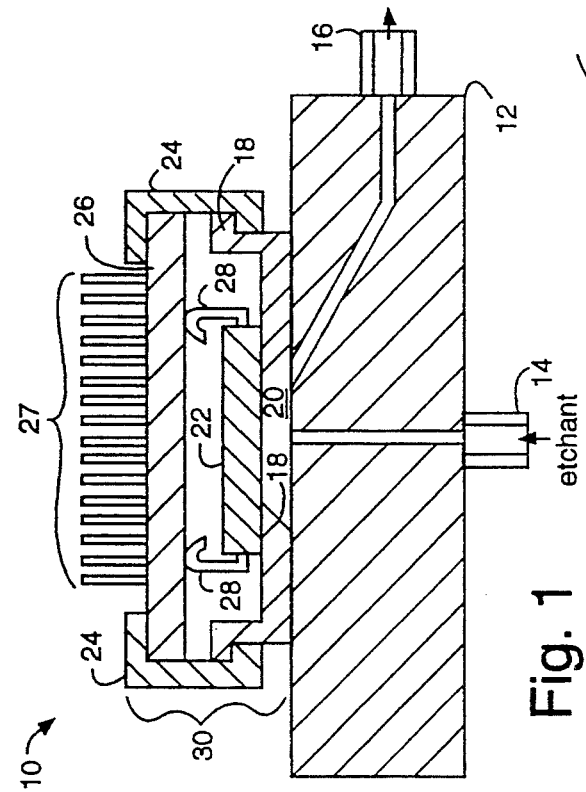
FIG. 1 shows a cross-sectional view of a decapsulation machine embodiment of the present invention with a fixture assembly mounted to an etch head body in position for injection of etchant solution toward a device-under-test.

FIG. 1 illustrates a decapsulation machine embodiment of the present invention, referred to herein by the general reference numeral 10. Decapsulation machine 10 comprises an etch head 12, an etchant solution supply 14, an etchant solution suction 16, an etch-resistant top plate 18, a cavity 20 within top plate 18 that opens up to contact a device-under-test (DUT) 22, a clamp 24 and a connector board 26 with a plurality of external pins 27. The etchant solution supply 14 and the etchant solution suction 16 include conduits that converge at the surface of the etch head 12 adjoining the surface of the top plate 18 within the area of cavity 20 DUT 22 includes a plurality of J-type leads 28 that contact board 26 and thus bring out the electrical connections of DUT 22 outside machine 10. Clamp 24 clamps DUT 22, connector board 26 and top plate 18 together into a fixture assembly 30. Etch head 12 and top plate 18 are preferably comprised of a material that is resistant to the etchant solution, e.g., polytetrafluoroethylene or stainless steel. Although only a single piping is shown in FIG. 1 for each of supply 14 and suction 16, one or both may alternatively comprise several pipings and accesses to cavity 20.

After decapsulation of the DUT 22, fixture 30 is removed from the etch head 12 and is rinsed and dried without exposing the pins of DUT 22 to moisture. This can be done with the machine described by Wensink '809, or by using etch head 12, while replacing the acid or solvent with water or other suitable rinsing medium.

Figure 2:
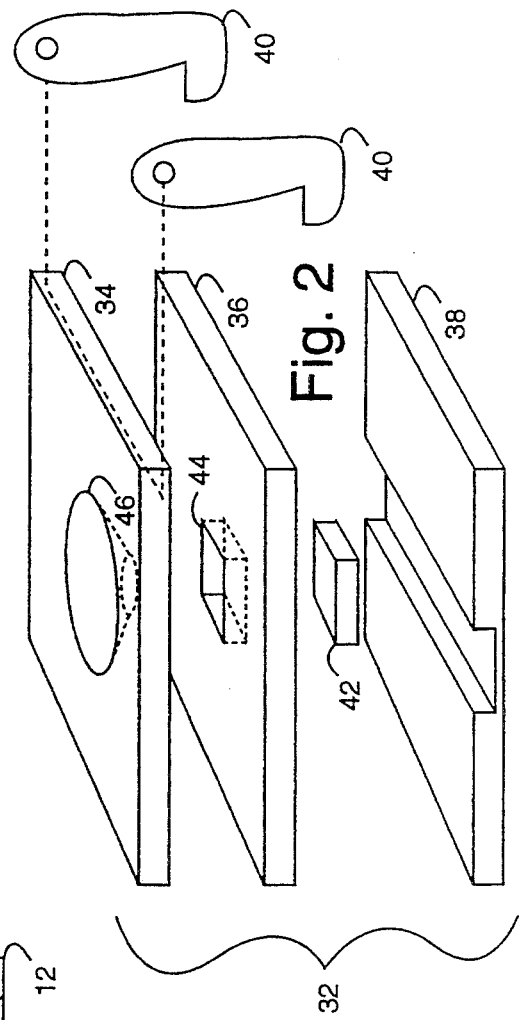
FIG. 2 is an exploded assembly perspective diagram of an alternative fixture assembly embodiment of the present invention.

FIG. 2 shows an alternative fixture 32 that may be used in machine 10 to replace fixture 30. An etch-resistant etch plate 34 is sandwiched together with a resilient gasket 36 and a connector plate 38 by a clamp 40. Etch plate 34 may be comprised of polytetrafluoroethylene or stainless steel. Gasket 36 may be comprised of rubber material to help form a vacuum seal. A DUT 42 represents a SOT plastic mold package. Its leads, which exit straight out the edges of the package, are held between the connector plate 38 and the gasket 36. A conical through-hole 46 has its widest opening toward an etchant solution circulation, such as in FIG. 1, and its smaller opening toward the DUT 42. The size and shape of the smaller end of through-hole 46 defines the area of decapsulation that will be dissolved in DUT 42. Gasket 36 avoids vacuum problems during the decapsulation process. DUT 42 remains in the fixture during subsequent testing and gasket 36 may be left in place to avoid damaging DUT 42 which becomes very fragile after decapsulation.

A method of decapsulation of plastic mold devices, e.g., integrated circuits, according to the present invention includes at least four steps. A device-under-test, such as DUT 22 or 42, is first fixtured into a removable assembly (e.g., 30 or 32) for attachment to an etch head 12 that circulates an etchant solution through a masking top plate 18 or 34 held in the fixture assembly 30 or 32 against the DUT and having an opening that defines an area of decapsulation to be dissolved in the DUT. The fixtured assembly is then placed on the etch head 12. An etchant solution is circulated through the etch head 12 until the area to be decapsulated has been dissolved. And the fixtured assembly is removed from the etch head 12 for rinsing of the decapsulated area to stop the etching action.

Alternatively, auxiliary heating can be provided to preheat the device-under-test to expedite the decapsulation process and prevent metal corrosion during intermediate observations.

Fixtures 30 and 32 need not necessarily be clamped shut. For example, a hinge or spring clips can be used to close the DUT 22 or 42 within. Such mechanisms are conventional and further detail is unnecessary to be able to construct a machine of the present invention.

Figure 3:
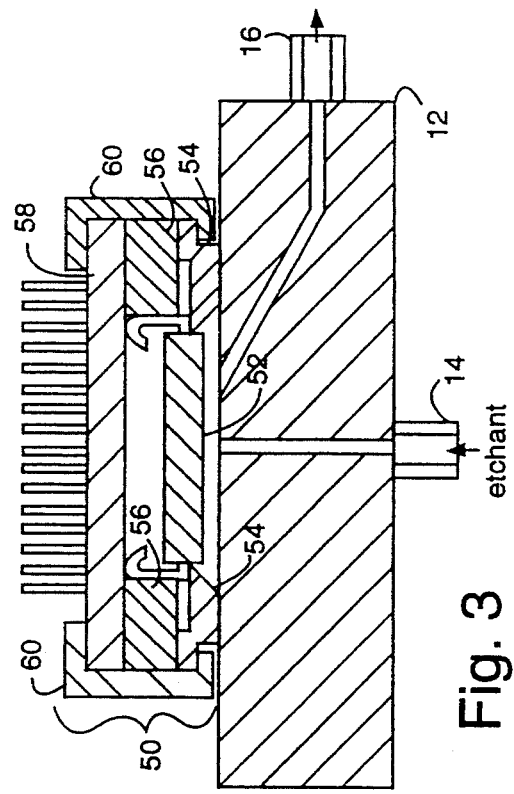
FIG. 3 is an alternative embodiment to that shown in FIG. 1 and has a gasket that seals the device-under-test to a connector plate to hold in a vacuum.

FIG. 3 illustrates an assembly 50 that can be used where a DUT 52 is to have its entire top removed during decapsulation. A top plate 54 surrounds the DUT 52 at its perimeter above the points on the sides where J-type leads protrude. A vacuum is maintainable by a gasket 56 between a connector support 58 and the top plate 54. The etchant solution supply 14 and the etchant solution suction 16 include conduits that converge at the surface of the etch head 12 adjoining the surface of the top plate 54 within the opening intruded into by the DUT 52. Etch-resistant material, e.g., polytetrafluoroethylene or stainless steel, is preferably used for the material of top plate 54. A clamp 60 holds fixture 50 together.

With an etch head without a shallow recess, the fixture should provide a recess in the etch or top plate part of the fixture. Decapsulation of small and fragile devices obviates the requirement for a shallow recess in the etch head, such as described by the present inventor, Ben L. Wensink, in U.S. Pat. No. 4,344,809, issued Aug. 17, 1982, and which is incorporated here by reference.

Although the present-invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A decapsulation device, comprising:
a flat etch plate including opposite first and second flat surfaces with said second flat surface extending over its entire respective side and hole between said first and second surfaces with a first inside diameter at said first flat surface and a second inside diameter at said second flat surface, said hole for circulating a liquid etchant against a surface spot on a device-under-test (DUT) plastic molded device package when in contact with said first flat surface of the flat etch plate; and
a flat etch head separate from the flat etch plate and including opposite third and fourth flat surfaces with said third flat surface extending over its entire respective side providing for a single plane of contact between said second and third flat surfaces and having at least one inlet conduit and at least one outlet conduit that have respective ends that converge, but do not join, proximate to one another on said third flat surface wherein, when said third surface is in contact with said second flat surface of the etch plate, said converging ends of said conduits within a region outlined by said second inside diameter of said hole in the flat etch plate and said conduits provide support for circulating said liquid etchant in said hole.

2. A decapsulation device, comprising:
a flat etch plate including opposite first and second flat surfaces with said second flat surface extending over its entire respective side and a hole between said first and second flat surfaces with a first inside diameter at said first flat surface and a second inside diameter at said second flat surface, said hole for circulating a liquid etchant against a surface spot on a device-under-test (DUT) plastic molded device package when in contact with said first flat surface of the flat etch plate;
a flat etch head separate from the flat etch plate and including opposite third and fourth flat surfaces with said third flat surface extending over its entire respective side providing for a single plane of contact between said second and third flat surfaces and having at least one inlet conduit and at least one outlet conduit that have respective ends that converge, but do not join, proximate to one another on said third flat surface wherein, when said third surface is in contact with said second flat surface of the etch plate, said converging ends of said conduits within a region outlined by said second inside diameter of said hole in the flat etch plate and said conduits provide support for circulating said liquid etchant in said hole; and
a connector board positioned to press said DUT into mechanical contact with said first flat surface of the flat etch plate and having a plurality of electrical contacts for making an electrical connection with a corresponding plurality of leads included in said DUT.

3. The device of claim 2, further comprising:
clamping means for holding the connector board, DUT and flat etch plate together sufficient to seal in said liquid etchant and sufficient to maintain said electrical connection.

4. The device of claim 2, further comprising:
a resilient gasket with a relief to vacuum seal and to hold said DUT, and positioned between the connector board and said first flat surface of the flat etch plate.

5. A decapsulation fixture, comprising:
an etch-resistant top plate having an opening in a contact side for a flat contact with a plastic mold packaged device-under-test (DUT) and an opening in an opposite flat side for circulation of an etchant solution from an etch head that is opposite to said contact side;
clamping means for holding the top plate in contact with said DUT; and
a connector board for electrically contacting said DUT and bringing out a plurality of connections external to said decapsulation fixture for electrical characterization of said DUT.

6. A decapsulation fixture, comprising:
an etch-resistant top plate having an opening in a contact side for a flat contact with a plastic mold packaged device-under-test (DUT) and an opening in an opposite flat side for circulation of an etchant solution from an etch head that is opposite to said contact side;
clamping means for holding the top plate in contact with said DUT; and
the top plate includes an opening for said DUT that fits around an outside perimeter of said DUT providing for the dissolving away of the entire top of said DUT by said circulation of said etchant solution.

7. The decapsulation fixture of claim 6, further comprising:

a connector board for electrically contacting said DUT and bringing out a plurality of connections external to said decapsulation fixture for electrical characterization of said DUT; and a gasket that provides for a seal between the top plate and said connector board.

* * * * *